United States Patent
Rueb

(10) Patent No.: US 9,245,062 B2
(45) Date of Patent: Jan. 26, 2016

(54) LASER PROJECTION SYSTEM USING VARIABLE PART ALIGNMENT

(71) Applicant: Virtek Vision International, Inc., Waterloo, Ontario (CA)

(72) Inventor: Kurt D. Rueb, Kitchner (CA)

(73) Assignee: Virtek Vision International Inc. (CA)

( * ) Notice: Subject to any disclaimer, the term of this patent is extended or adjusted under 35 U.S.C. 154(b) by 508 days.

(21) Appl. No.: 13/719,382

(22) Filed: Dec. 19, 2012

(65) Prior Publication Data
US 2013/0253682 A1 Sep. 26, 2013

Related U.S. Application Data

(60) Provisional application No. 61/614,252, filed on Mar. 22, 2012.

(51) Int. Cl.
*G06F 17/50* (2006.01)
*G01C 11/00* (2006.01)
*G01C 15/00* (2006.01)

(52) U.S. Cl.
CPC .............. *G06F 17/50* (2013.01); *G01C 11/00* (2013.01); *G01C 15/002* (2013.01)

(58) Field of Classification Search
USPC .................................. 700/98; 356/614; 250/4
See application file for complete search history.

(56) References Cited

U.S. PATENT DOCUMENTS

| | | | |
|---|---|---|---|
| 5,010,634 A | 4/1991 | Uemura et al. | |
| 5,646,859 A | 7/1997 | Petta et al. | |
| 5,920,483 A | 7/1999 | Greenwood et al. | |
| 6,317,953 B1 | 11/2001 | Pryor | |
| 6,590,669 B1* | 7/2003 | Wagner | 356/601 |
| 6,980,881 B2 | 12/2005 | Greenwood et al. | |
| 7,047,614 B2 | 5/2006 | Scott et al. | |
| 7,463,368 B2 | 12/2008 | Morden et al. | |
| 7,480,037 B2 | 1/2009 | Palmateer et al. | |
| 7,555,157 B2* | 6/2009 | Davidson et al. | 382/154 |
| 8,187,778 B2 | 5/2012 | Choi et al. | |
| 8,218,001 B2 | 7/2012 | Hastilow | |
| 2004/0189944 A1* | 9/2004 | Kaufman et al. | 352/10 |
| 2005/0058332 A1* | 3/2005 | Kaufman et al. | 382/133 |
| 2005/0121422 A1* | 6/2005 | Morden et al. | 219/121.6 |
| 2005/0157920 A1 | 7/2005 | Doherty et al. | |
| 2006/0033713 A1* | 2/2006 | Pryor | 345/158 |
| 2008/0250659 A1 | 10/2008 | Bellerose et al. | |

(Continued)

FOREIGN PATENT DOCUMENTS

| | | | |
|---|---|---|---|
| EP | 0995545 B1 | 4/2000 | |
| EP | 1622196 B1 | 2/2006 | |

*Primary Examiner* — Kidest Bahta
(74) *Attorney, Agent, or Firm* — Warner Norcross & Judd LLP

(57) ABSTRACT

A method of projecting a template on a workpiece provides a measurement system for determining a location of a workpiece and a laser projector for projecting a laser template. A feature on the workpiece having geometric significance is identified. A physical location of the feature in a three dimensional coordinate system is determined and compared to a theoretical location of the feature on computer model of the workpiece. A template correlated to the feature is selected. The projection of the template onto the workpiece relative to the feature is optimized by correlating alignment of the physical location of the feature with the computer model of the feature. The template is projected onto the workpiece based upon the optimized projection for directing work to be performed on the workpiece.

22 Claims, 3 Drawing Sheets

(56) References Cited

U.S. PATENT DOCUMENTS

2009/0144008 A1 6/2009 Yokoyama
2012/0066898 A1 3/2012 Gustafsson et al.
2012/0130528 A1 5/2012 Stark et al.

* cited by examiner

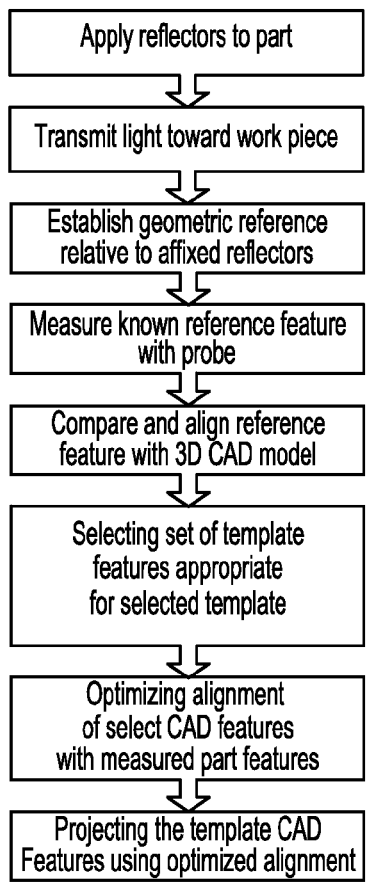
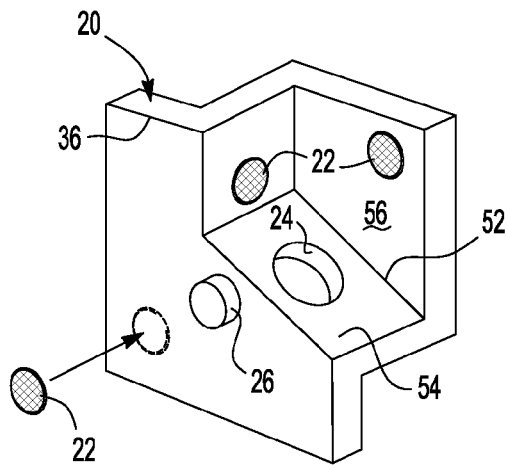
Fig-2
Fig-3
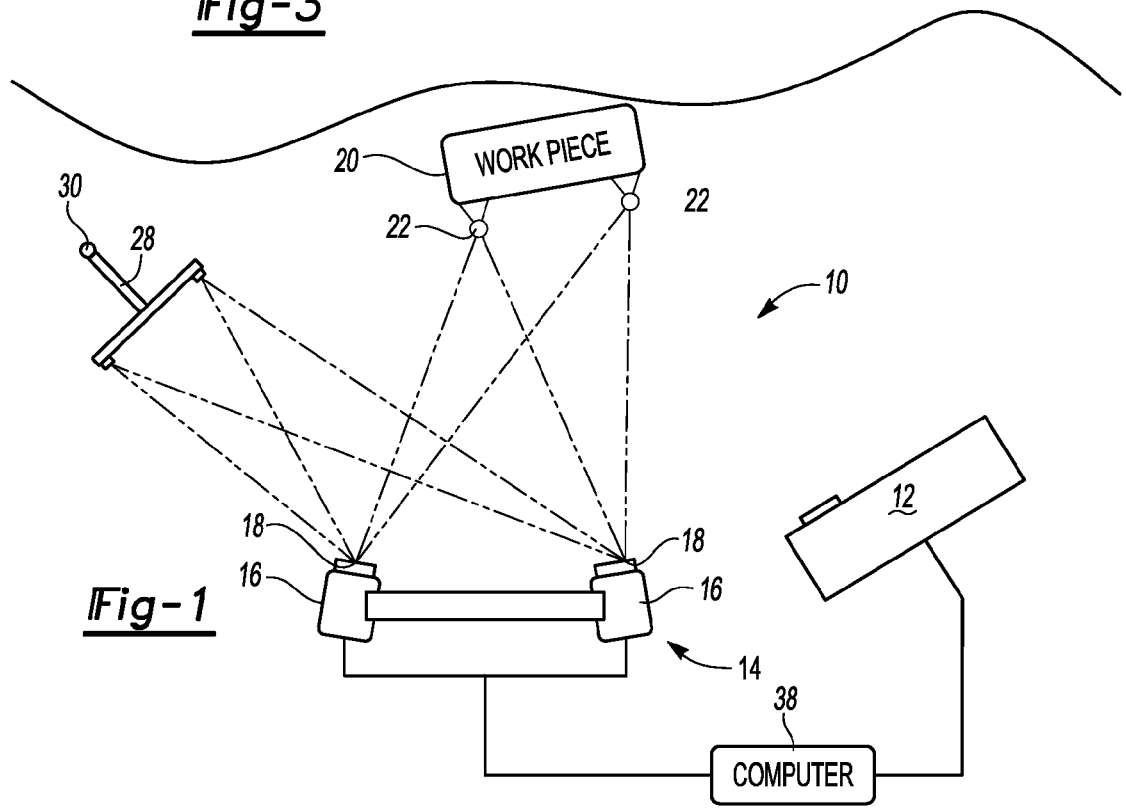
Fig-1

LASER PROJECTION SYSTEM USING VARIABLE PART ALIGNMENT

PRIOR APPLICATIONS

This application claims priority to U.S. Provisional Patent Application No. 61/614,252 filed on Mar. 22, 2012.

FIELD

The present invention relates generally toward a method of projecting a laser template onto a workpiece. More specifically, the present invention relates toward a method of aligning a laser projected template with geometrically relevant features of the workpiece.

BACKGROUND

Improvements in the dimensional accuracy of a manufacturing process are an objective of every manufacturing facility. Statistical quality control has made use of geometric dimensioning and tolerancing (GD&T) with a focus on various datums or relevant features of a workpiece. Rather than attempting to achieve dimensional accuracy of an entire workpiece, statistical quality control now focuses primarily on dimensional accuracy of various datums and relevant features of a workpiece.

Many large workpieces, such as, for example, components of heavy manufacturing equipment, require manual operations to assemble and apply various elements to the workpiece. Presently, most manufacturing facilities make use of physical templates to direct an operator to the location of the workpiece requiring a manufacturing operation be performed. However, physical templates fail to accurately locate multiple datums or relevant features on a workpiece when more than one surface or feature of the workpiece does not accurately reflect a computer model of the workpiece from which a physical template has been designed.

Furthermore, physical templates for use with large workpieces are large, cumbersome and heavy making the templates difficult, and sometimes dangerous, to move into and out of a manufacturing workspace. Still further, physical templates must be replaced or reworked when a workpiece has been modified or redesigned. This is expensive, time consuming, and known to cause delays when implementing new product designs.

Therefore, it would be desirable to provide a method of locating a template upon a workpiece that is not geometrically accurate relative to a computer model of the workpiece and aligning the template with relevant features or datums corresponding to a GD&T plan for manufacturing the workpiece.

SUMMARY

A method of projecting a template onto a workpiece includes a system for determining a location of the workpiece, and a laser projector for projecting a laser template onto the workpiece. Features on the workpiece having geometric significance are identified. The physical locations of the features having geometric significance are determined in a three dimensional coordinate system and the physical location of these features are compared with a theoretical location of the features on a computer model of the workpiece. A template for directing work on the workpiece is correlated to the feature having geometric significance. The projection of the template onto the workpiece is optimized relative to the feature by correlating alignment of the physical location of the feature with the computer model of the feature. The template is projected onto the workpiece based upon the optimized projection for directing work to be performed on the workpiece.

Physical templates have been unable to account for part variation to accurately locate the template relative to features on the workpiece having geometric significance. Therefore, the tolerance on a workpiece, and more specifically large workpieces, has not been adequately narrow to provide sufficient dimensional accuracy to meet modern quality standards. The laser projection template that is aligned with at least one or more geometrically significant features solves many of the problems associated with physical manufacturing templates and provides the ability to significantly improve a dimensional accuracy of a manufactured workpiece.

BRIEF DESCRIPTION OF THE DRAWINGS

Other advantages of the present invention will be readily appreciated, as the same becomes better understood by reference to the following detailed description when considered in connection with the accompanying drawings:

FIG. 1 shows a schematic representation of an alignment system for a laser projector of the present invention;

FIG. 2 shows a reflective element affixed to a workpiece;

FIG. 3 shows a flow chart setting forth the steps of the method of the present invention;

DETAILED DESCRIPTION

Figure 4:
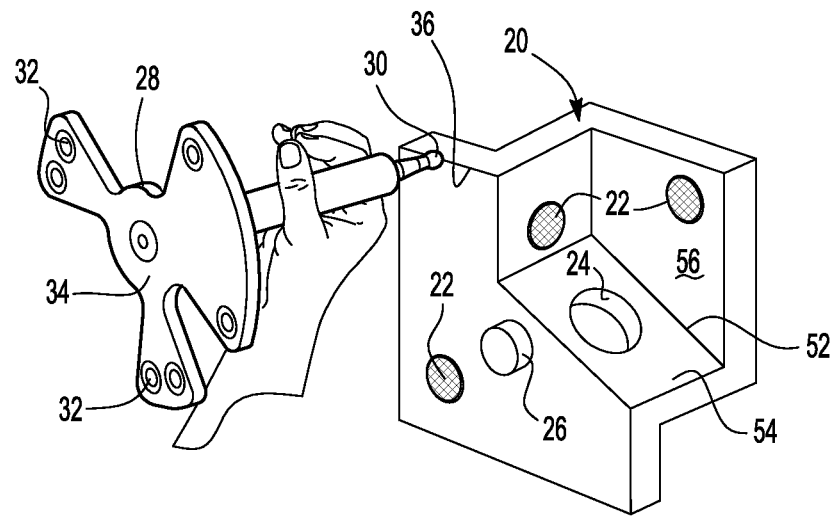
FIG. 4 shows a locating probe used to identify geometrically significant features of the workpiece.

The method of the present invention makes use of the laser projection system generally shown at 10 of FIG. 1. The system 10 is generally based upon that which is disclosed in co-pending U.S. patent application Ser. No. 13/652,735, the content of which is incorporated herein by reference. While one embodiment of the inventive laser projection system is explained in this application, it should be understood by those of skill in the art that other embodiments of the system 10 are also within the scope of this application.

The laser projection system 10 includes a laser projector 12 and a photogrammetry assembly 14. In one embodiment, the photogrammetry assembly 14 makes use of cooperative cameras 16, each being associated with light emitting devices 18. The light emitting devices transmit light in the direction of a workpiece 20 that include temporarily affixed reflective elements 22, which reflect light back toward the cameras 16 of the photogrammetry assembly 14. Based upon detection of the light reflected from the workpiece 20, the photogrammetry assembly establishes a measurement system for determining the location of the workpiece 20 in a three dimensional coordinate system. As set forth in U.S. patent application Ser. No. 13/652,735, a location of the laser projector 12 is determined relative to the workpiece 20 and the photogrammetry assembly 14 by projecting arbitrary laser images around the work space in which the workpiece 20 is located so that the cameras 16 can identify the arbitrary images and correlate through triangulation the location of the laser projector 12.

FIG. 2 shows a three dimensional workpiece 20 on which reflective elements 22 have been affixed to various surfaces. The workpiece 20 includes a first feature 24 having geometric significance and a second feature 26, also having geometric significance. Each feature 24, 26 is selected as part of a GD&T system from which work performed on a workpiece 20 requires accurate dimensional correlation. Therefore, the features 24, 26 are also datums associated with the GD&T system to establish dimensional accuracy of the workpiece. The flow chart shown in FIG. 3 details the steps of the variable part alignment method of the present invention.

Once the features 24 and 26 have been identified, the physical location of the features 24, 26 is determined by associating a probe 28 with each feature 24, 26. For example, the probe 28 includes a contact element 30 that is positioned onto predetermined feature 24, 26. Several different probes 28 having alternative contact features can be used as will be evident further below. Each probe 28 includes a series of probe reflective elements 32 spaced around a reflective surface 34 at identifiable fixed locations. Therefore, light reflected from the probe reflective elements 32 not only identify a geometric location of a feature 24, 26, but also identify a particular probe 28 being used. Referring again to FIG. 1, the probe 28 is represented reflecting light originating from a light emitting device 18 back toward the cameras 16 of the photogrammetry assembly 14.

Referring now to FIG. 4, the probe 28 is represented as a hand held device, and in this example, is used to locate the actual edge 36 of a workpiece in the geometric coordinate system. The probe 28 is moved to various positions on the workpiece 20 including the first feature 24 and the second feature 26 to locate the features 24, 26 in the geometric coordinate system. The laser projector 12 also projects an image onto geometrically relevant features 24, 26 of the workpiece 20 to direct the operator locate the features for measurement with the probe 28. Additional features may also be located to conform to the GD&T plan, if necessary. The photogrammetry assembly 14 is now able to determine the actual location of the workpiece 20 in the geometric coordinate system based upon various scans of the location of the probe 28. Scans of the reflective elements 22 that are affixed to different surfaces of the workpiece 20 are used to provide a fixed reference on the workpiece 20 so that the workpiece 20 can be re-located in the geometric coordinate system should the photogrammetry assembly 14 or any of the components of the system 10 or the workpiece 20 be moved. Therefore, the system 10 maintains a fixed relationship with the measurements of the geometrically relevant features 24, 26 and the workpiece 20. It should be understood by those of skill in the art that the geometric location of the workpiece 20 and of the geometric significant features 24, 26 can be determined by the photogrammetry assembly 24 scanning a combination of reflective elements 22 probe reflective elements 32 and laser images projected onto the workpiece 20.

The computer 38 is programmed with the computer model of the workpiece 20 from a computer aided design or equivalent theoretical model of the workpiece 20. The computer model is represented at 42 on the computer screen 40 alongside an image of the actual workpiece 20 as established in the geometric coordinate system. Therefore, the computer 38 provides an image of the actual part or workpiece 20 and of the theoretical or computer model of the workpiece 42.

Figure 5:
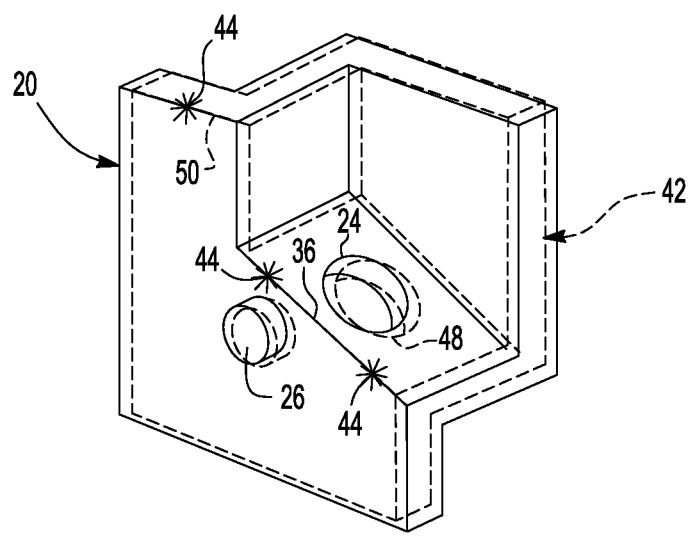
FIG. 5 shows an alignment of the actual workpiece with a computer model of the workpiece showing dimensional inconsistencies between the workpiece and the theoretical model.

A computer algorithm was generated to compare the image of the actual workpiece 20, and more particularly the geometric significant features 24, 26, with the computer model 42 of the workpiece 20 to determine the dimensional accuracy of the actual workpiece 20, as produced, relative to the computer model of 42. As is known to those of ordinary skill in the art, manufacturing variability rarely results in a physical workpiece matching a theoretical model of the workpiece. As best seen in FIG. 5, an overlay of the scan of the actual workpiece 20, based upon the scan generated by the photogrammetry assembly 14, is made with the computer model 42. The geometric variability of the actual workpiece 20 with a computer model 42 is shown where surfaces and features 24, 26 do not align. An operator can identify the location of the probe measurements by the asterisk 44 and the reflective element 22 by way of identifier 23. As set forth above, various features 24, 26 of the actual workpiece 20 do not align with the features shown on the computer model 42 as is typical of a real life situation. Therefore, projecting a laser image onto the workpiece based upon either the actual workpiece 20 or the computer model 42 does not provide an accurately located template. A hierarchy of associations has been developed and implemented by way of the computer algorithm to overcome the problem associated with projecting a laser template onto a workpiece 20 that does not correspond to a computer model 42 of the workpiece. The hierarchical system has been developed to select the datum or feature 24, 26 having the most geometric significance to a location of a projected template 46 followed by selected secondary datums having a lesser geometric significance.

Figure 6:
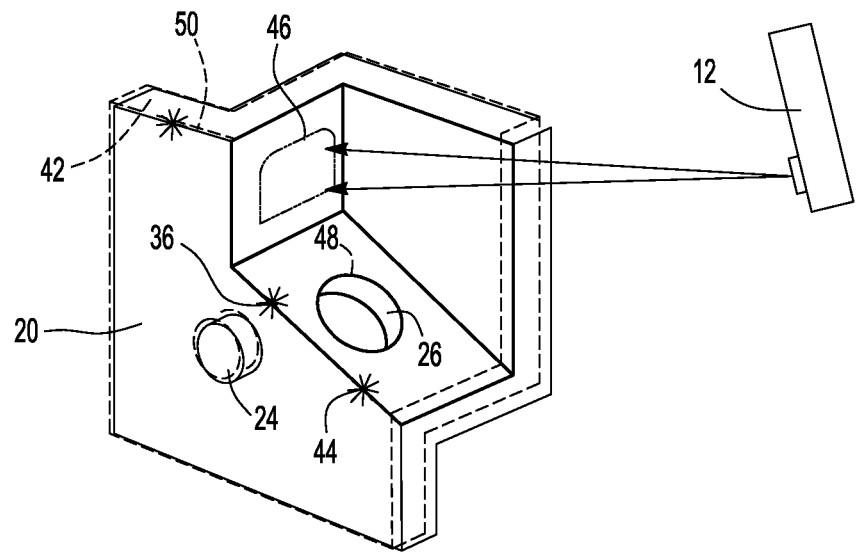
FIG. 6 shows a theoretical alignment of geometric significant features in the laser projection showing the alignment.

For example, once a desired template 46 has been selected from a look up menu, the computer selects a primary feature such as, for example, the first feature 24 on the actual workpiece 20 and aligns that feature 24 with a first theoretical feature 48 of the computer model 42. A second relevant feature such as, for example, the edge of the workpiece 36 is then aligned with the theoretical edge 50 of the computer model 42. The computer continues to align datums or relevant features in a hierarchical order to achieve the optimum alignment of datums with a surface onto which the template 46 is projected by the laser projector 12. This is best represented in FIG. 6 where the first feature 24 of the workpiece 20 is shown aligned with the first theoretical feature 48 and the edge 36 of the workpiece 20 is aligned with the theoretical edge 50 of the computer model 42. Once a satisfactory alignment has been achieved with the datums or geometric significant features, the laser projector 12 projects a laser template 46 onto the workpiece directing an operator to the location where a manufacturing operation is to be performed.

Referring now to FIG. 6, additional steps to continuously and accurately project the template 46 onto the workpiece in real time are performed once the algorithm comparing the workpiece 20 to the computer model 42 is initiated. For example, as set forth above, a plurality of features such as, for example, an aperture identified as the first feature 24 and the edge 36 of the workpiece 20 are selected and assigned a hierarchy of importance so that the computer can align the most important feature as a primary alignment and a second most important feature as a secondary alignment. Therefore, the primary feature may have perfect alignment with the computer model 42 while a secondary feature may be slightly out of alignment. Alternatively, an average alignment of the primary and secondary features may be adopted to accurately project the template 46 onto the workpiece 20. Weighted values may also be assigned to the primary and secondary features corresponding to the template 46 being projected onto the workpiece 20. Therefore, the computer algorithm decides which feature is most important to align by providing an accurate projection of the template 46 onto the workpiece 20.

It has been determined that further control of the level of constraint of measured datum features is desirable by providing a weighted scale to the individual constraints associated with the feature. As such, the computer algorithm also controls the individual geometric constraints of each relevant feature or datum. For example, a planar surface on a workpiece 20 measured for the purpose of receiving a projected a template 46 might have its orientation fixed relative to a measured plane, but allow freedom of movement perpendicular to that surface. Therefore, the planar surface would be constrained to rotate only around an axis perpendicular to the planar surface but would be allowed complete freedom of position provided the theoretic planar surface remains parallel to the actual measured surface.

This approach can reproduce the traditional hierarchical specification of datum constraints but the fixed constraint hierarchy can be overly restrictive and may cause a projection onto a surface of the workpiece 20 to be inaccurate, where the theoretical proper position is "suspended" above the surface of the workpiece 20. To avoid this scenario, a weight is assigned to the individual constraints of a datum or datums to allow more flexible application in the alignment process. Thus, the computer 38 may be programmed to assign a less restrictive constraint arrangement to a primary datum and may apply a more restrictive constraint arrangement to a secondary or tertiary datum features or even apply constraints of an arbitrarily large set of datum features.

Based upon the geometrically relevant features, the relative importance of each datum is established so that the constraints will produce the most accurate projection onto the workpiece 20. For example, a datum plane feature may constrain two degrees of freedom to establish the orientation relative to a surface while a secondary feature may only constrain the offset to the surface. Alternatively, if six relevant geometric features are selected, each might establish only a single constraint to establish the location of the part. If the alignment is over-constrained the specified weights provide the ability to balance the over-constrained set of features to achieve a desired functional alignment for projecting an accurate template 46 onto the workpiece 20.

In operation, a datum group is selected for a desired template 46. The most critical datum might be a geometrically relevant feature 24, such as, for example, the bored hole shown in FIG. 7. The hole is measured with the probe 28 as set forth above so that the computer determines the actual location of the hole. A secondary datum is an edge between a surface defining the bored hole and an adjacent surface, and a final datum is the location of the adjacent surface. A predetermined weighting is assigned to each degree of freedom of each datum so that the location of the projected template is sufficiently accurate to meet the necessary manufacturing tolerance. The bored hole, being the most critical datum is assigned two and possibly three constraints. The secondary datum is assigned two or one constraint and the final datum establishes only the offset to the surface. Each constraint is also assigned a weight so that an average of the weights us used to align the actual planar surface with the theoretical planar surface so that the projected template is accurately located on the actual planar surface, and not suspended in space.

Additional features on the workpiece are identifiable by way of the photogrammetry assembly 14 scanning laser projections onto the feature from the laser projector 12. For example, a laser image is projected onto a transition 52 between adjacent first and second surfaces 54, 56 of the workpiece 20. The cameras 16 and the photogrammetry assembly 14 scan the laser projection onto the transition 52 identifying the location of the transition 52 for the computer 38.

Figure 7:
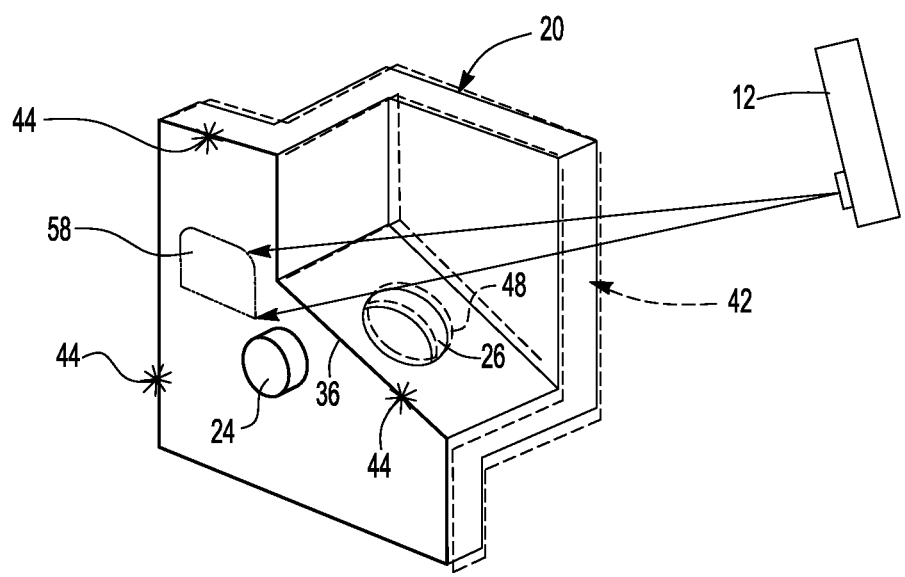
FIG. 7 shows a secondary alignment of geometric significant features with the theoretical model.

The laser projection system 10 monitors the location of the workpiece by monitoring the location of the reflective elements 22. If the laser projection system 10 determines the reflective elements 22 are no longer in the last scanned position, the computer 38 recalculates the location of the measured features or datums 24, 26 from the new location of the reflective elements 22. As such, the laser projector 12 is capable of projecting real time images onto the workpiece 20 based upon the location of the reflective elements 22 as best shown in FIG. 7.

Once the first and second feature 24, 26 are located on the workpiece 20, movement of the workpiece 20 or of the laser projection system 10 does not require the features 24, 26 to be relocated. The computer 38 merely relocates the feature 24, 26 in the geometric coordinate system relative to the new location of the workpiece 20. So that an operator can continuously monitor the accuracy of the laser projection of the template 46 on the workpiece 20, the laser projector 12 also projects an asterisk 44 or other image onto the location of the workpiece 20 at which a measurement has been taken. Therefore, once an operator removes the probe 28 from the workpiece, the laser projector 12 projects the asterisk 44 or other image onto the location the contact element 30 of the probe 28 contacted the workpiece 20 to provide an ergonomically effective measurement process. Additionally, the laser projector 12 projects the location of the next feature to be measured to direct the operator to the next work function. The photogrammetry assembly 14 continuously monitors the location of all the projections onto the workpiece 20 so that the computer 38 can make correction to the measurements to continuously update the projection of the template 46 to an accurate geometric location. For example, the laser projector 12 projects an image onto the geometrically relevant feature 24, 26, such as, for example, an outline projection onto a hole so that an operator can monitor the accuracy of the projection of the template 46 onto the workpiece 20.

Once a template 46 has been accurately projected onto the workpiece 20 and the manufacturing operation has been performed as directed by the template 46, the computer algorithm directs the laser projector 12 to project a second template 58 onto a different location of the workpiece 20 for a second manufacturing operation. Prior to projecting the second template 58, the steps set forth above are repeated so that the second feature 26 now becomes the primary feature as dictated by a hierarchy or weighted average for projecting the second template 58. If additional measurements are required, an operator can again use the probe 28 or alternative probe to locate the second feature 26 or other features on the workpiece 20. As best represented in FIG. 7, a third surface 60 of the workpiece 20 is now aligned with the computer model 42 and the first surface 54 and second surface 56, being no longer relevant in the GD&T plan is no longer aligned by the computer algorithm. It should be understood by those of skill in the art that multiple templates 46, 58, can be projected onto a workpiece 20 by repeating the steps of locating various features on the workpiece in the manner set forth above.

The invention has been described in an illustrative manner, and it is to be understood that the terminology which has been used is intended to be in the nature of words of description rather than of limitation. It is now apparent to those of skill in the art that many modifications and variations of the present invention are possible in light of the above teachings. It is, therefore, to be understood that the invention may be practiced otherwise and as specifically described.

What is claimed is:

1. A method of projecting a template on a workpiece; comprising the steps of:
providing a measurement device for determining a location of a workpiece in a three dimensional coordinate system and a laser projector for projecting a laser beam for generating a laser template on the workpiece;
identifying a feature on the workpiece having geometric significance for accurate manufacturing of the workpiece;
using said measurement device for determining a physical location of the feature in a three dimensional coordinate system and measuring an offset between the physical location of the feature in the three dimensional coordinate system from a theoretical location of the feature of a computer model of the workpiece;
using a computer for aligning the physical location of the feature as identified by said measurement device with the theoretical location of the feature from the computer model and determining an optimized location for projection of the laser template onto the workpiece by said laser projector by tracing the path of the laser beam through pattern coordinates transformed by the measured offset; and
projecting the template onto the workpiece based upon the optimized location for directing work to be performed on the workpiece.

2. The method set forth in claim 1, wherein said step of optimizing the projection of the template onto the workpiece is further defined by identifying a physical location of a surface of the workpiece onto which the template is projected and optimizing projection of the template onto the physical location of the surface.

3. The method set forth in claim 1, wherein said step of providing a measurement device is further defined by providing a photogrammetry system.

4. The method set forth in claim 3, wherein step of providing a photogrammetry systems is further defined by providing at least one camera capable of detecting light conveyed from the workpiece.

5. The method set forth in claim 1, wherein said step of optimizing the projection of the template onto the workpiece is further defined by correlating the computer model to a second feature on the workpiece and optimizing the projection by aligning the feature and the second feature to the computer model.

6. The method set forth in claim 5, wherein said step of optimizing the projection by aligning the feature and the second feature to the computer model is further defined by assigning a hierarchy of importance to the feature and the second feature and optimizing the projection relative to the hierarchy.

7. The method set forth in claim 5, wherein said step of optimizing the projection by aligning the feature and the second feature to the computer model is further defined by assigning weighted values to the feature and the second feature corresponding to the template being projected by the laser projector.

8. The method set forth in claim 1, further including the step of correlating the measurement device and the laser projector in a common three dimensional coordinate system.

9. The method set forth in claim 1, wherein said step of determining a physical location of the feature in a three dimensional coordinate system is further defined by associating a reflective element to the feature for reflecting light to the measurement device.

10. The method set forth in claim 9, wherein the reflective element is further defined as being associated with a locating probe and the locating probe is distinguishable by an orientation of a plurality of the reflective elements on the locating probe.

11. The method set forth in claim 9, further including the step of projecting an image onto the workpiece at the physical location of the feature defined by associating the reflective element with feature.

12. The method set forth in claim 2, wherein said step of identifying a physical location of a surface of the workpiece onto which the template is projected is further defined by associating a reflective element to the feature for reflecting light to the measurement device.

13. The method set forth in claim 1, wherein said step of identifying a feature on the workpiece having geometric significance is further defined by identifying an edge or inside surface of an aperture defined by the workpiece.

14. The method set forth in claim 1, wherein said step of identifying a feature on the workpiece having geometric significance is further defined by identifying a transition between adjacent surfaces.

15. The method set forth in claim 1, wherein said step of identifying a feature on the workpiece having geometric significance is further defined by identifying the feature on the workpiece by projecting a laser image onto the feature.

16. The method set forth in claim 1, further including the step of the measurement device monitoring the location of the workpiece for drift from an original location of the workpiece and correcting the projecting of the laser template based upon the monitored location of the workpiece.

17. The method set forth in claim 1, further including the step of projecting a laser image onto the workpiece correlating the theoretic location of the feature defined by the computer model to the physical location of the feature on the workpiece.

18. The method set forth in claim 1, further including the step of projecting real time laser images onto the workpiece associated with the feature being measured.

19. The method set forth in claim 1, further including the step of projecting a laser image identifying previously obtained measurements.

20. The method as set forth in claim 1, further including the step of the measurement device scanning laser projections for correcting prior measurements of the feature.

21. The method set forth in claim 1, further including the step of selecting a second laser template and identifying an alternative feature on the workpiece having geometric significance to the second laser template for locating and projecting the second laser template.

22. The method set forth in claim 1, further including the steps of selecting a plurality of features on the workpiece having geometric significance, assigning a weight to constraints associated with degrees of freedom of each feature, and evaluating an optimal location for the template based upon the measured position of the features and the assigned weights of the associated constraints.

* * * * *